United States Patent

[11] 3,591,832

[72] Inventor Horst Pelka
Munich, Germany
[21] Appl. No. 037,460
[22] Filed May 18, 1970
[45] Patented July 6, 1971
[73] Assignee Siemens Aktiengesellschaft
Berlin and Munich, Germany
[32] Priority Oct. 20, 1966
[33] Germany
[31] S106597
Continuation of application Ser. No. 676,308, Oct. 18, 1967, now abandoned.

[54] ELECTRONIC OVERLOAD PROTECTION CIRCUITS
3 Claims, 3 Drawing Figs.

[52] U.S. Cl. ........ 317/23, 317/33
[51] Int. Cl. ........ H02h 3/08
[50] Field of Search ........ 317/23, 33 R, 33 VR

[56] References Cited
UNITED STATES PATENTS
3,122,697 2/1964 Kauders ........ 317/33 X
3,131,344 4/1964 Rosenfeld ........ 317/33 X

*Primary Examiner*—James D. Trammell

ABSTRACT: An electronic overload protection circuit arrangement for an output transistor stage having an electronic switch connected across the input of the stage and controlled from the output of the stage. A control input for the electronic switch is obtained from a potential divider that is itself connected in series with the load between the supply terminals of the stage.

PATENTED JUL 6 1971 3,591,832

ELECTRONIC OVERLOAD PROTECTION CIRCUITS

This application is a continuation of application Ser. No. 676,308, filed Oct. 18, 1967 now abandoned.

The invention relates to electronic overload protection circuits for guarding transistors against excess currents of the type caused, for example, by a short circuit across a load impedance. Overload protection circuits of this nature may be particularly useful with the output transistors of data receivers or the like.

To be fully effective, an overload circuit for use in transistorized equipment must have a rapid response, and therefore the types of circuit employing electromagnetic safety devices are often much too slow, as are many forms of electronic overload protection arrangements.

One object of the present invention is to provide an overload protection circuit arrangement which is capable of very rapid response when a particular current value is exceeded in the load circuit of the transistor to be protected.

THe invention consists in an electronic overload protection circuit arrangement for guarding an output transistor against excess currents in the event of a reduction in or short circuit of its load impedance, wherein an electronic switch is connected across the input circuit of an output transistor which is to be protected, and a control electrode of said electronic switch is connected to a tapping point of a potential divider connected in parallel with the main current path of said output transistor and in series with the output load between the supply terminals.

In this way, the transistor to be protected is automatically rendered nonconductive in the event of any excess current, and at the same time the voltage divider forms a bypass circuit to guard the transistor against any excess voltage in the event of a short circuit of the load.

The invention will now be described with reference to the accompanying drawings, in which.

Figure 1:
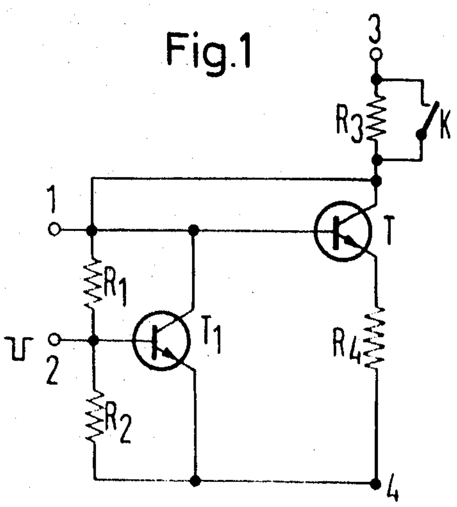
FIG. 1 shows the basic circuit diagram of an exemplary embodiment.

In FIG. 1, a transistor T is provided with an electronic switch in the form of a control transistor T1, to protect it against overloads. The transistor T has a load resistance R3 connected between its collector and a terminal 3 of the power supply source, and a resistor R4 connected between its emitter and the other terminal 4, of the power supply source. In this embodiment, the transistor T is an NPN transistor, so that the terminal 3 is positive with respect to the terminal 4. The base of the transistor T is connected to an input signal terminal 1, and also to the supply terminal 4 via the control transistor T1. The transistor T may be the output stage of an amplifier, or a driver stage for an electrical relay, and to protect the transistor T from excess currents in the event of a reduction in or short circuit of the load impedance, as symbolized by the switch K, the collector-emitter path of the transistor T1 is connected parallel to the base-emitter circuit of the output transistor T. A potential divider consisting of resistors R1 and R2 is connected between the collector of the transistor T and the terminal 4, whilst the base of the control transistor T1 is connected to the tapping point formed by the junction of the resistors R1, R2, A control terminal 2 is provided for the application of a resetting pulse to the base of the transistor T1.

During normal operation of the output transistor stage, there is only a low voltage (some few volts) across the collector-emitter path of the transistor T. If this voltage is increased, for instance in the event of a short circuit (the closing of the symbolic switch K) then the potential at the tapping of the potential divider also increase, so that the base of the transistor T1 is rendered conductive, and shunts the input circuit of the transistor T, to cut it off and render the input terminal 1 ineffective.

With the output transistor blocked, the collector voltage is high, so that the safety device remains operative, and cannot be reset. Only when the short circuit K is actually removed can the control transistor T1 be blocked by means of a resetting pulse at the terminal 2 to allow the transistor T to conduct again. This resetting pulse can be derived automatically from the input signal by an RC network, or differentiator.

Figure 2:
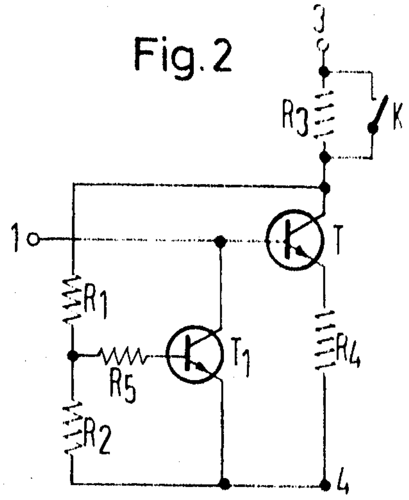
FIG. 2 shows a modified embodiment.

In the modified circuit shown in FIG. 2, a series resistance R5 is connected between the tapping point and the base of transistor T1, and the resistance values of R1, R2 and R5 are selected so that when the short circuit is removed the safety device automatically cuts off, so that a resetting pulse source is not required.

Figure 3:
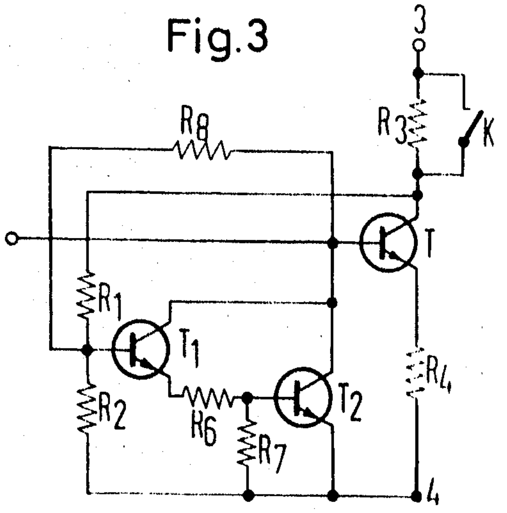
FIG. 3 shows a further exemplary embodiment.

In the further exemplary embodiment of the invention shown in FIG. 3, the electronic switch consists of a pair of transistors T1, T2. The first transistor T1 is connected in an emitter follower circuit, and the base of a control transistor T2 is connected to the junction of two resistors R6 and R7 connected in series in the emitter path of T1 to form a potential divider. In addition, a feedback path is provided from the collector of the transistor T2 via a resistance R8 to the base of the transistor T1. The circuit arrangement is so designed that on removal of a short circuit in the load circuit of the output transistor T, the electronic switch formed by the transistors T1 and T2 is automatically blocked again, to remove the shunting of the input circuit of the transistor T automatically.

I claim:

1. Apparatus for preventing excessive current flow through a semiconductor switching element having an output load circuit of a predetermined magnitude connected thereto so that the current flowing through said load circuit is controlled by said switching element and wherein said switching element has a first control electrode whereby the application of a predetermined voltage thereto will cause said switching element to change between its conducting and nonconducting states, said apparatus comprising:

first transistor means with the switching path thereof being connected, via said first control electrode, across the input to said semiconductor switching element and operable for diverting said control voltage from said first control electrode thereby rendering said switching element nonconductive, said first transistor means having a second control electrode for changing the state of said first transistor means between its conductive and nonconductive states responsive to a voltage applied thereto, said first transistor means having an emitter-follower output circuit, voltage sensing means for sensing the voltage across said semiconductor element and applying same to said control electrode, said first transistor means being operable in response to a predetermined increase in the current flow through said load circuit and thereby an increase in the voltage across said semiconductor element, and second transistor means having the switching path there connected, via said first control electrode, across the input to said semiconductor switching element, said second transistor means having a third control electrode connected to receive the voltage output from said emitter follower output circuit, said first and second transistors forming a two-stage transistor switching state.

2. The apparatus defined in claim 1 wherein said voltage sensing means comprises a voltage divider connected in parallel with said load circuit of said semiconductor switching element, said voltage divider having a tapping point to which said second control electrode is connected.

3. The apparatus defined in claim 1 comprising in addition feedback circuit means connecting the switching path of said second transistor means to said second control electrode.